US009621773B2

(12) United States Patent
Kettunen et al.

(10) Patent No.: US 9,621,773 B2
(45) Date of Patent: Apr. 11, 2017

(54) OPTICAL IMAGING APPARATUS, IN PARTICULAR FOR COMPUTATIONAL IMAGING, HAVING FURTHER FUNCTIONALITY

(71) Applicant: Heptagon Micro Optics Pte. Ltd., Singapore (SG)

(72) Inventors: Ville Kettunen, Rüschlikon (CH); Markus Rossi, Jona (CH)

(73) Assignee: Heptagon Micro Optics Pte. Ltd., Singapore (SG)

( * ) Notice: Subject to any disclaimer, the term of this patent is extended or adjusted under 35 U.S.C. 154(b) by 0 days.

(21) Appl. No.: 14/768,989

(22) PCT Filed: Feb. 7, 2014

(86) PCT No.: PCT/SG2014/000051
§ 371 (c)(1),
(2) Date: Aug. 19, 2015

(87) PCT Pub. No.: WO2014/129968
PCT Pub. Date: Aug. 28, 2014

(65) Prior Publication Data
US 2016/0006913 A1    Jan. 7, 2016

Related U.S. Application Data

(60) Provisional application No. 61/768,138, filed on Feb. 22, 2013.

(51) Int. Cl.
*H04N 5/225* (2006.01)
*H01L 27/146* (2006.01)
(Continued)

(52) U.S. Cl.
CPC ..... *H04N 5/2254* (2013.01); *H01L 27/14618* (2013.01); *H01L 27/14625* (2013.01);
(Continued)

(58) Field of Classification Search
CPC ............... H04N 5/2259; H04N 5/2254; H04N 13/0282; G03B 7/08; G06K 9/209
(Continued)

(56) References Cited

U.S. PATENT DOCUMENTS

2007/0211164 A1    9/2007 Olsen et al.
2008/0191298 A1*   8/2008 Lin ....................... G01J 1/4204
                                                                257/432
(Continued)

FOREIGN PATENT DOCUMENTS

WO    2011/156926    12/2011
WO    2013/010284    1/2013

OTHER PUBLICATIONS

Australian Patent Office, International Search Report for Patent Application No. PCT/SG2014/000051 (dated May 13, 2014).

*Primary Examiner* — Kelly L Jerabek
(74) *Attorney, Agent, or Firm* — Fish & Richardson P.C.

(57) ABSTRACT

The optical apparatus comprises a semiconductor substrate and at least one optics substrate. The semiconductor substrate comprises a first active region establishing a first image sensor, said semiconductor substrate further comprising an additional active region, different from said first active region. The additional active region establishes or is part of an additional sensor which is not an image sensor. And the at least one optics substrate comprises for said first image sensor at least one lens element for imaging light impinging on the optical apparatus from a front side onto the first image sensor. Preferably, at least two or rather at least three image sensors are provided, such that a computational camera can be realized. The additional sensor may comprise, e.g., an ambient light sensor and/or a proximity sensor.

15 Claims, 3 Drawing Sheets

(51) Int. Cl.
   *H04N 5/369*    (2011.01)
   *H04N 9/04*     (2006.01)
   *H04N 5/238*    (2006.01)

(52) U.S. Cl.
   CPC .. *H01L 27/14645* (2013.01); *H01L 27/14685* (2013.01); *H04N 5/2253* (2013.01); *H04N 5/2257* (2013.01); *H04N 5/2258* (2013.01); *H04N 5/369* (2013.01); *H04N 9/045* (2013.01); *H01L 2924/0002* (2013.01)

(58) Field of Classification Search
   USPC .................................... 348/335, 340, 366
   See application file for complete search history.

(56) References Cited

U.S. PATENT DOCUMENTS

| | | | |
|---|---|---|---|
| 2008/0303918 A1* | 12/2008 | Keithley | G09G 3/20 348/223.1 |
| 2009/0067055 A1* | 3/2009 | Yamamura | B29D 11/00278 359/622 |
| 2009/0251587 A1* | 10/2009 | Kim | H04N 5/23293 348/333.12 |
| 2010/0327164 A1* | 12/2010 | Costello | G01D 5/34715 250/338.1 |
| 2011/0025905 A1 | 2/2011 | Tanaka | |
| 2011/0122308 A1 | 5/2011 | Duparre | |
| 2011/0134078 A1 | 6/2011 | Hsu et al. | |
| 2012/0176533 A1* | 7/2012 | Cellier | G03B 7/0997 348/362 |
| 2013/0075595 A1* | 3/2013 | Ruh | G01S 7/4814 250/221 |

\* cited by examiner

OPTICAL IMAGING APPARATUS, IN PARTICULAR FOR COMPUTATIONAL IMAGING, HAVING FURTHER FUNCTIONALITY

TECHNICAL FIELD

The invention relates to the field of optics, more particularly micro-optics, and in particular to optical devices or apparatuses useful in imaging, in particular when computational imaging is accomplished in a device or apparatus not purely dedicated to image capturing. It relates to methods and apparatuses according to the opening clauses of the claims. Such devices and apparatuses may find application, e.g., in handheld applications such as in mobile communication and/or mobile computing.

Note that imaging and photography and in particular computational imaging and computational photography is not limited to still photography, i.e. to capturing single images in a usually time-wise unrelated fashion, but may also comprise the capturing of sequences of images, i.e. to filming and videoing.

DEFINITION OF TERMS

"Active optical component": A light sensing or a light emitting component. E.g., a photodiode, an image sensor, an LED, an OLED, a laser chip. An active optical component can be present as a bare die or in a package, i.e. as a packaged component.

"Passive optical component": An optical component redirecting light by refraction and/or diffraction and/or (internal and/or external) reflection such as a lens, a prism, a mirror, or an optical system, wherein an optical system is a collection of such optical components possibly also comprising mechanical elements such as aperture stops, image screens, holders.

"Opto-electronic module": A component in which at least one active and at least one passive optical component is comprised.

"Replication": A technique by means of which a given structure or a negative thereof is reproduced. E.g., etching, embossing, imprinting, casting, molding.

"Wafer": A substantially disk- or plate-like shaped item, its extension in one direction (z-direction or vertical direction) is small with respect to its extension in the other two directions (x- and y-directions or lateral directions). Usually, on a (non-blank) wafer, a plurality of like structures or items are arranged or provided therein, typically on a rectangular grid. A wafer may have openings or holes, and a wafer may even be free of material in a predominant portion of its lateral area. A wafer may have any lateral shape, wherein round shapes and rectangular shapes are very common. Although in many contexts, a wafer is understood to be prevailingly made of a semiconductor material, in the present patent application, this is explicitly not a limitation. Accordingly, a wafer may prevailingly be made of, e.g., a semiconductor material, a polymer material, a composite material comprising metals and polymers or polymers and glass materials. In particular, hardenable materials such as thermally or UV-curable polymers are interesting wafer materials in conjunction with the presented invention.

"Light": Most generally electromagnetic radiation; more particularly electromagnetic radiation of the infrared, visible or ultraviolet portion of the electromagnetic spectrum.

BACKGROUND OF THE INVENTION

Imaging and photography has been made available to a very wide public by providing corresponding functionalities in mobile communication devices and handheld computing devices.

In computational imaging, a final image is obtained by processing sub-images, wherein, at least usually, each of the sub-images describes substantially the identical scene, which, of course, also is substantially identical with the scene of the final image. The sub-images are taken with different optical properties in the optical channels, typically and as an example, the sub-images are taken at different colors, e.g., one sub-image is created by capturing red light only, another one by capturing blue light only, and another one (or two) by capturing green light only. The final image can then be a full color image, e.g., an RGB image.

From US 2011/025905 A1, examples for computational cameras are known.

In US 2007/211164 A1, examples for computational cameras are disclosed.

SUMMARY OF THE INVENTION

One object of the invention is to create an improved optical apparatus, more particularly an optical apparatus improved in that it not only provides means for use in (computational) imaging, but also further means useful for a different purpose. On the one hand, a corresponding optical apparatus shall be provided which may be anything from an optical module (more specifically: opto-electronic module) for use in a camera or in an electronic or other device to an electronic or optical or computational device such as a smartphone, and on the other hand, a method of manufacturing such an optical apparatus shall be provided.

Another object of the invention is to provide a particularly small or compact optical apparatus.

Another object of the invention is to provide a particularly highly integrated optical apparatus.

Another object of the invention is to provide an optical apparatus in which the semiconductor material (typically silicon) is particularly efficiently made use of.

Another object of the invention is to provide an optical apparatus having a particularly useful combination of functionalities.

Another object of the invention is to provide an optical apparatus which is mass-manufacturable.

Another object of the invention is to provide a device having photographic, in particular computational camera capability and an additional sensor, in particular an additional optical sensor, wherein the device is more simple to manufacture than without the invention and/or wherein a housing of the device has less openings or transparent areas or a smaller opening or transparent area than without the invention.

Further objects emerge from the description and embodiments below.

At least one of these objects is at least partially achieved by apparatuses and methods according to the patent claims and/or the aspects described below.

There are various aspects to the invention. Common to most of them is that the semiconductor die (semiconductor substrate) in which at least one image sensor is present is particularly efficiently made use of, namely by using space on the semiconductor die not required for image capturing for a different purpose, more particularly for an additional sensor. In case two or more image sensors are realized on the semiconductor substrate for capturing sub-images in computational imaging, the die is particularly efficiently made use of by using space on the semiconductor die not required for capturing sub-images for such a different purpose, more particularly for an additional sensor.

In a rather general aspect, the invention concerns the integration of at least one image sensor and of an additional sensor (or sensor portion) on a single semiconductor die (semiconductor substrate), wherein said additional sensor (or sensor portion) is not an image sensor, or at least, detection results obtained by means of said additional sensor (or sensor portion) are not interpreted as an image and/or are not used during obtaining an image based on a detection result of said at least one image sensor. Note that the kind of image sensors (one- two- or three- or even more sub-sets of pixels for different wavelength ranges or colors) and the number of image sensors is generally not limited. E.g., there may be one or two or more image sensors for full-color detection, e.g., with interdispersed pixels for red, for green and for blue light, e.g., distributed as known from the well-known Bayer pattern (RGGB); and alternatively to one or more of such image sensors for full-color detection or in addition thereto, there may be another one or two or three or more image sensors for monochromatic light detection, wherein the monochromatic light may correspond to white light detection or to detection of light of a specific color only which can be, e.g., red only or blue only or green only. Accordingly, an image sensor for red light detection, an image sensor for blue light detection and an image sensor for green light detection may be combined with one (or more) image sensors for full-color detection like described above. Of course, any image sensor or combination of two or more image sensors such as the before-described ones or the farther below described ones may be combined, in general with any kind of additional (non-image) sensor (or sensor portion) and with any number of additional (non-image) sensors (or sensor portions). There may be one, two or three or even more of such additional sensors (or sensor portions) which may be of different kind or partially or all be of the same kind. Various kinds of possible additional sensors are mentioned throughout the present patent application, e.g., proximity sensors (in particular optical proximity sensors), ambient light sensors, temperature sensors. In a first sub-aspect of said rather general aspect, the invention concerns a module, more specifically an opto-electronic module, comprising at least one image sensor plus an additional sensor which is not an image sensor. All sensors present, or at least the active optical components thereof, are realized in one and the same semiconductor die.

In a second sub-aspect of said rather general aspect, the invention concerns a device or optical apparatus comprising a semiconductor substrate (semiconductor die) as described in that aspect and/or a module as described in said first sub-aspect.

In a first aspect, the invention concerns the integration of two, possibly of three or even four, image sensors and of an additional sensor (or sensor portion) on a single semiconductor die (semiconductor substrate), wherein said additional sensor (or sensor portion) is not an image sensor, or at least, detection results obtained by means of said additional sensor (or sensor portion) are not interpreted as an image and/or are not used during reconstruction of a final image from (sub-) images captured by means of said image sensors.

In a second aspect, the invention concerns a module comprising two image sensors (for capturing sub-images for computational imaging) plus an additional sensor which is not an image sensor. All these sensors, or at least one or more active optical components of each of them, are realized in one and the same semiconductor die. In particular, at least one of the image sensors may comprise, usually on the semiconductor die, a patterned filter letting light of different color pass to different pixels of that image sensor.

In a first sub-aspect of the second aspect, a first one of the at least two image sensors has a checkerboard pattern, e.g., such that red and blue light portions are let pass through to neighboring pixels. In particular, a second one of the image sensors is illuminated by green light only. For the latter, a green filter may be provided, e.g., on the semiconductor die or on an optics substrate attached to the semiconductor die.

In a second sub-aspect of the second aspect, a first one and a second one of the at least two image sensors has a checkerboard pattern. These can in particular be designed in such a way that red and green light portions are let pass through to neighboring pixels of the first image sensor and that blue and green light portions are let pass through to neighboring pixels of the second image sensor. This way, already with these two image sensors alone, a (full) color image may be obtained in computational imaging, wherein obtaining this final image is facilitated by the fact that a mutual (computational) alignment of the respective sub-images (of first and second image sensor, respectively) is facilitated by the presence of green pixels in both sub-images.

In a third aspect, the invention concerns a module comprising three image sensors (for capturing sub-images for computational imaging) plus an additional sensor (or a portion thereof) which is not an image sensor. All these sensors, or at least one or more active optical components of each of them, are realized in one and the same semiconductor die.

In a first sub-aspect of the third aspect, the three image sensors are provided for capturing sub-images of different color each. E.g., one image sensor detects red light only, another blue light only, and the third one green light only.

In a second sub-aspect of the third aspect, the first one of the image sensors comprises a patterned filter letting pass light of different color to different pixels of that first image sensor (similarly to the second aspect above; e.g., red and blue), whereas the other two image sensors are provided for capturing sub-images of the same color, e.g., green. This may facilitate composing the final image from the sub-images.

In a third sub-aspect of the third aspect, the three image sensors are arranged (e.g., with their respective centers of gravity) on three corners of a rectangle, and the additional sensor (or portion thereof) is located in that area (or at least overlaps that area) which would be taken by a (not present) fourth image sensor (of the same size as the others are) which would be arranged (with its center of gravity) on the fourth corner or said rectangle in the same manner as the other image sensors are arranged on the other three corners.

In a fourth aspect, the invention concerns a module comprising four image sensors (for capturing sub-images for computational imaging) plus an additional sensor (or a portion thereof) which is not an image sensor. All these sensors, or at least the active optical components thereof, are realized in one and the same semiconductor die. In particular, the four image sensors may all be provided for detecting light of different colors; or two of the image sensors are for detecting light of the same color (e.g., green), whereas the other two are for detecting different colors, e.g., one for red and one for blue.

In a first sub-aspect of the fourth aspect, the additional sensor is located in the middle between the four image sensors. More particularly, the four image sensors are arranged (e.g., with their respective centers of gravity) on the four corners of a rectangle, and the additional sensor (or portion thereof) covers an area comprising the center of gravity of that rectangle, wherein it may, more particularly, be centered about the center of gravity of that rectangle.

In a fifth aspect, the invention concerns a module comprising one or more image sensors (in particular two or more image sensors, for capturing sub-images for computational imaging) plus two additional sensors which are not image sensors. All these sensors, or at least one or more the active optical components of each of them, are realized in one and the same semiconductor die. These two additional sensors can in particular be two sensors of different type, e.g., one being an ambient light sensor, the other being a proximity sensor.

In a first sub-aspect of the fifth aspect, three image sensors are provided, arranged like described in the third sub-aspect of the third aspect (cf. there), and one of the additional sensors (or a portion thereof) is arranged also like described there. And the second additional sensor is located "in the middle", like described first sub-aspect of the fourth aspect (cf. there). This can be a particularly space-saving arrangement of the various sensors.

In a sixth aspect, the invention concerns a module like described in one or more of the other aspects, wherein the module furthermore comprises at least one optics substrate. An optics substrate usually comprises one or more passive optical components, but no active optical component. Typically, the optics substrate comprises one or more lens elements. In particular, the optics substrate may comprise at least one lens element for each of the image sensors of the module. The module may furthermore comprise at least one additional lens element for the additional sensor of the module.

In such a module, several optical channels may be formed, in particular one for each image sensor (comprising one lens element each) and another one for the or for each additional sensor. The optics substrate usually is attached (fixedly attached; directly or indirectly) to the semiconductor substrate bearing the image sensors.

In a first-sub-aspect of the sixth aspect, the optics substrate comprises a spacer substrate or is attached (directly or indirectly) to the semiconductor substrate via a spacer substrate. The spacer substrate may be manufactured separately from the optics substrate or may be integrally formed therewith. Usually, a spacer substrate comprises a multitude of through-holes, typically one for each image sensor, and usually also one for the (or for each) additional sensor. A spacer substrate can make possible to establish a precisely defined (vertical) distance between adjacent substrates, such as between the semiconductor substrate and the optics substrate (and, more particularly, the lens elements comprised therein). Furthermore, a spacer substrate, if made of a non-transparent material or coated with a non-transparent coating, may allow to avoid or at least suppress detection of stray light or otherwise undesired light. It may thus contribute to better defining the above-mentioned optical channels.

In a second sub-aspect of the sixth aspect, two (or rather at least two) optics substrates are provided. This may allow to provide even more lens elements per image sensor (and/or for the additional sensor). It may be provided that the second optics substrate is arranged on that side of the first optics substrate which is opposed to the side on which the semiconductor substrate is arranged. A spacer substrate like the one described above may be present between the two optics substrates which may be integrated on one of the optics substrates or may be manufactured separately from them.

In a seventh aspect, the invention concerns a module like described in one or more of the other aspects, wherein said additional sensor is photosensitive, i.e. is designed for detecting light. A filter may be provided in order to limit light detectable by said additional sensor to certain wavelength ranges. E.g., a filter may be provided in order to prevent the detection of infrared radiation, or a filter may be provided in order to limit light detectable by said additional sensor to infrared light. The latter may be useful in case said additional sensor is a proximity sensor (one based on emission and detection of infrared light); and the former may be useful in case said additional sensor is an ambient light sensor, in particular if an infrared-light-based sensor (e.g., proximity sensor) is provided, too, in particular if both sensors are integrated in the same module. Generally, in case of an ambient light sensor as an additional sensor, light may be detected independent of the color of the light—wherein exclusion of infrared light may be advantageous.

Alternatively, the additional sensor may be a different type of sensor, a not-photosensitive sensor, e.g., a micromechanical sensor or a capacitive sensor, such as a temperature sensor based on such principles.

In a first sub-aspect of the seventh aspect, the additional sensor is an ambient light sensor. An ambient light sensor can be useful, e.g., for adjusting a brightness of emitted light, in particular a brightness of a display (a visual display) may be adjusted in dependence of a detection result of an ambient light sensor. E.g., when the ambient light sensor detects a high light intensity, the brightness of the display will be high, whereas when the ambient light sensor detects a lower light intensity, the brightness of the display will be decreased.

In a second sub-aspect of the seventh aspect, the additional sensor is a proximity sensor. An proximity sensor can be useful, e.g., for switching off a (visual) display when it must be assumed, based on a detection result of the proximity sensor, that the display is not looked at, e.g., because it must be assumed that a user of a device comprising the module holds the device close to his ear, e.g., for phoning. The proximity sensor may have a basic design and/or functionality, e.g., like described in WO 2013/010284. Details are given in thas publication, and therefore, this WO 2013/010284 A is herewith incorporated by reference in the present patent application. In particular, the proximity sensor may comprise an emission channel and a detection channel which are usually mutually optically isolated, the emission channel for emitting light—in a continuous or, rather, in a pulsed fashion—generally detectable in the detection channel, wherein typically infrared light is emitted and detected. If an object such a the head of a user is relatively close to a front side of the module, a sufficiently large amount of light emitted from the emission channel is reflected back into the module and can be detected in the detection channel, thus indicating proximity. Accordingly, a display may be switched off for the time being. With no object close enough to the front side of the module, a too low amount of light emitted by the emission channel is reflected back into the module, the low (or vanishing) light intensity detectable in the detection channel then indicating that no object seems to be close to the front side of the module, and, accordingly, the display could be switched on again (unless there is another reason not to do so).

The additional sensor (realized in the semiconductor substrate also comprising the image sensors) can be part of the detection channel, e.g., provided with an infrared filter (letting only infrared light pass), and a photo diode or laser diode may be provided as a light emitter for the emission channel. Since it may be difficult to integrate a light emitter in the semiconductor substrate, a photo diode or laser diode may be attached thereto and/or may be in electrical (more specifically galvanic) contact with the semiconductor substrate—e.g., by wire-bonding. The light emitter may also be mounted on a base substrate on which also the semiconductor substrate is mounted.

In an eighth aspect, the invention concerns a module like described in one or more of the other aspects, wherein an image processing unit for obtaining a final image based on data captured by the image sensor is provided. In particular, it can be provided that the so-obtained final image is independent of detection results of the additional sensor. The image processing unit may be integrated, fully or in part, in the semiconductor substrate, it may be comprised, fully or in part, in the module, and/or it may be comprised, fully or in part, in a device comprising the module. In particular in the latter case, the image processing unit may be comprised in a central processing unit or in a graphics processor of the device. Such a device may be, e.g., a handheld communication device and/or a handheld computing device and/or a handheld photographic device.

In a sub-aspect of the eighth aspect, at least two image sensors are provided, and the image processing unit is provided for accomplishing computational imaging, more particularly for obtaining the final image based on the (sub-) images captured by the two or more image sensors.

In a ninth aspect, the invention concerns a module like described in one or more of the other aspects, wherein an evaluation unit for evaluating detection results obtained by means of the additional sensor (or a corresponding active region of the semiconductor substrate) is provided. The evaluation unit may, e.g., output signals or data indicative of whether or not proximity is detected (cf. proximity sensor, second sub-aspect of the seventh aspect above) and/or data indicative of a brightness of ambient light (cf. ambient light sensor, first sub-aspect of the seventh aspect above) and/or data indicative of a temperature (in case the additional sensor is a temperature sensor).

In particular, it can be provided that a final image obtained based on image data outputted by the one or more image sensors is independent of detection results of the additional sensor and thus of data or signals outputted by the evaluation unit. The evaluation unit may be integrated, fully or in part, in the semiconductor substrate, it may be comprised, fully or in part, in the module, and/or it may be comprised, fully or in part, in a device comprising the module. In particular in the latter case, the evaluation unit may be comprised in a central processing unit of the device. Such a device may be, e.g., a handheld communication device and/or a handheld computing device and/or a handheld photographic device.

In a tenth aspect, the invention concerns a device or optical apparatus comprising a semiconductor substrate (semiconductor die) and/or a module as described in one or more of the above aspects. More specifically the device or optical apparatus may be a device or optical apparatus capable of imaging (using the one or more image sensors), in particular of computational imaging (using two or more image sensors) and having another functionality involving said additional sensor. The device or optical apparatus may be, e.g., a handheld communication device and/or a handheld computing device and/or a handheld photographic device.

In a first sub-aspect of the tenth aspect, the device or optical apparatus comprises a housing and an opening or transparent portion in said housing. Inside the housing, the semiconductor substrate is arranged such that the one or more image sensors of the semiconductor substrate can detect light impinging on the housing and passing the opening or transparent portion, at least provided the impinging light comprises light of suitable wavelengths. Provided the additional sensor is generally capable of detecting light, the semiconductor substrate is furthermore also arranged such that a photosensitive portion (or active region) of the additional sensor can detect light impinging on the housing and passing the opening or transparent portion, at least provided the impinging light comprises light of suitable wavelengths.

Such an opening or transparent portion may be continuous for all purposes of the module. It may be very small, and it may be sufficient to have exactly one such opening or transparent portion only for all purposes of the module.

In a second sub-aspect of the tenth aspect, the device or optical apparatus comprises a display unit, and more particularly, wherein the display unit is controlled in dependence of a detection result of the additional sensor. E.g., the display of the display unit is controlled in dependence of a signal outputted by the additional sensor, in particular wherein the additional sensor is or comprises an ambient light sensor and/or a proximity sensor (cf. also the first and second sub-aspects of the seventh aspect above). The display unit may, e.g., comprise a control unit controlling the display, wherein the control unit is operationally connected with the additional sensor and, more particularly with an evaluation unit thereof.

In an eleventh aspect, the invention concerns a method for manufacturing a module and/or device or optical apparatus as described in one of the aspects above. It is in particular possible to manufacture the semiconductor substrates on wafer level and, separately therefrom, also the optics substrates on wafer level. A separated semiconductor substrate and a separated optics substrate may then be joined, possibly with a spacer substrate between them. Therein, it may be provided that the joining is accomplished via a base substrate on which the semiconductor substrate is mounted.

Note that the above aspects (and sub-aspects) of the invention may, of course be combined, as far as logically possible. This will also become clear from the text further below.

Note that whenever it is referred to red, blue and green color in the present patent application, it is certainly also possible to replace these colors by different (e.g., complementing) colors, e.g., by cyan, magenta and yellow ("CMY" instead of "RGB").

Aspects and embodiments of the invention are also described in the patent claims. Some of them are cited in the following.

The optical apparatus comprises
a semiconductor substrate;
at least one optics substrate;
wherein said semiconductor substrate comprises a first active region establishing a first image sensor, said semiconductor substrate further comprising an additional active region, different from said first active region, said additional active region establishing or being part of an additional sensor which is not an image sensor, and wherein said at least one optics substrate comprises for said first image sensor at least one lens element for imaging light impinging on the optical apparatus from a front side onto the first image sensor.

An image sensor usually is a pixel array, a two-dimensional arrangement of light-sensitive elements (pixels). An image sensor may be considered a photo-sensitive sensor with spatial resolution.

Said semiconductor substrate substantially forms a contiguous piece of semiconductor (or semiconductor-based) material or a single-piece semiconductor substrate, in which said first image sensor (and, if present, also further image sensors) and said additional active region are present, usually created using semiconductor processing steps. And, the one or more image sensors and said additional active region are not separate semiconductor parts which, after dicing (from one and the same or from two or more different wafers), would have to be arranged with respect to each other, but the one or more image sensors and said additional active region are integrated in the same semiconductor substrate, manufactured in one and the same substrate.

In particular in case no more than a one image sensor, namely said first image sensor, is comprised in the semiconductor substrate, that first image sensor may have different subsets of pixels, dedicated to the detection of light of different colors. The pixels of those subsets may in particular be interdispersed, e.g., forming the well-known Bayer pattern (RGGB). In case of two or more image sensors, other configurations may be contemplated, in particular such that a final color image is computed from images of different image sensors dedicated to the detection of light of different colors by computational imaging. Cf. elsewhere in the present patent application for further details concerning such computational imaging.

Said lens elements may be refractive and/or diffractive ones. They may in particular be manufactured using replication, in particular using embossing. They may furthermore be made of a curable epoxy material. Note that the term "lens element" may, in an extended understanding of the invention, be replaced by the term "passive optical component", which comprises lens elements but also further elements.

Said semiconductor substrate may comprise a pixel array comprising said first image sensor and said additional active region. Alternatively, said first active region is separated from additional active region by at least one intermediate region of said semiconductor substrate which is not specifically structured for detecting light and/or which is not used for detecting light.

In the first case, a first set pixels of the pixel array may be read out in order to obtain an image taken by means of said first image sensor, and another set of one or more pixels of the pixel array may be read out in order to detect light impinging on said additional active region.

In the second case, the intermediate region may be basically unstructured, at least in part, or may be, at least in part, structured and configured for another purpose, e.g., for image processing and/or evaluating.

In many-embodiments, the additional active region allows to detect light. This may be the case, e.g., if the additional sensor is at least one of
  an ambient light sensor;
  a proximity sensor;
  a pyroelectric temperature sensor.

But also other types of sensors may be provided, e.g., capacitive/micro-mechanical temperature sensors.

The optical apparatus may also be referred to as a device. It may in particular be at least one of
  an opto-electronic module;
  a module for a device with photographic capability, in particular with computational camera capability;
  a device with a display, in particular with a visual display;
  a device with a housing, in particular with a housing having an opening or transparent portion;
  a handheld computing device;
  a handheld photographic device;
  a handheld communication device;
  a smartphone;
  a tablet computer.

In one embodiment which may be combined with one or more of the above-mentioned embodiments, the optical apparatus comprises an image processing unit operationally connected the first image sensor (and, if present, also to further image sensors), for receiving image data from the first image sensor (and, if present, also from the further image sensors), and for obtaining a final image the received said image data.

Typically, it is provided that said final image is independent of detection results obtained by means of said additional active region. And typically, the processing in the image processing unit is carried out independent of what is detected in said additional active region.

In one embodiment which may be combined with one or more of the above-mentioned embodiments, said at least one optics substrate comprises at least one additional lens element for imaging light impinging on the optical apparatus from a front side onto said additional active region. This may allow to gather more light onto said additional active region thus possibly contributing to an improved sensitivity of said additional sensor. Note that here, the term sensitivity may refer, e.g., to enhanced low-light sensitivity and/or to an increased angular range of light directable onto said additional active region.

In one embodiment which may be combined with one or more of the above-mentioned embodiments, said semiconductor substrate comprises, in addition, a second active region different from said first active region and from said additional active region, said second active region establishing a second image sensor, and wherein said at least one optics substrate comprises for each of said image sensors at least one lens element for imaging light impinging on the optical apparatus from a front side onto the respective image sensor.

It is usually provided that said first image sensor is not identical with said second image sensor.

In one embodiment referring to the last-mentioned embodiment, the optical apparatus is structured for detecting light of substantially different color ranges in said first and said second image sensors. For example, the first image sensor detects green light only, whereas the second image sensor detects, in a portion of its pixels, red light only, and in another portion of its pixels, blue light only, e.g., the second image sensor being provided with a patterned filter such as one for establishing a checkerboard-pattern-like distribution of red-detecting and blue-detecting pixels.

Alternatively (or even additionally), the optical apparatus could be structured for detecting light in said first and said second image sensors at different optical parameters such as different focal lengths.

In one embodiment referring to one or both of the before-mentioned embodiments, a first optical axis defined by the first image sensor and a second optical axis defined by the second image sensor are aligned in parallel. Said first optical axis can as well be defined by the respective at least one lens element associated with the first image sensor. And said second optical axis can as well be defined by the respective at least one lens element associated with the second image sensor.

Typically, the parallel alignment is realized at least within 5°. It is usually provided that the at least two image sensors all capture light substantially from the same scene—at least if the scene is not too close to the optical apparatus, such as within a centimeter or within 10 centimeters.

In one embodiment referring to one or more of the three last-mentioned embodiments, (i) said semiconductor substrate comprises a pixel array comprising said first and second image sensors and optionally also said additional active region;

or (ii) said first and second active regions are separated from each other by at least one intermediate region of said semiconductor substrate which is not specifically structured for detecting light and/or which is not used for detecting light.

In the first case (i), a first set pixels of the pixel array is read out in order to obtain an image (or rather sub-image) taken by means of said first image sensor, and a second set of pixels of the pixel array (different from the first set) is read out in order to obtain an image (or rather sub-image) taken by means of said second image sensor. It is furthermore possible to provide that yet another set of one or more pixels of the pixel array may be read out in order to detect light impinging on said additional active region.

In the second case (ii), the intermediate region may be basically unstructured, at least in part, or may be, at least in part, structured and configured for another purpose, e.g., for image processing and/or evaluating.

In one embodiment referring to one or more of the four last-mentioned embodiments, said semiconductor substrate comprises a third active region different from said first and second active regions, said third active region establishing a third image sensor, and wherein said at least one optics substrate comprises for said third image sensor at least one lens element for imaging light impinging on the optical apparatus from said front side onto the third image sensor.

For example, one image sensor is provided for detecting green light, another image sensor for detecting red light, and a third one for detecting blue light. Or, in another example, two image sensors are provided for detecting green light, whereas a third one has pixels for detecting red light and other pixels for detecting blue light, these pixels usually being interdispersed, e.g., like in a checkerboard pattern. With two image sensors detecting light of the same color, a registration of the images captured by the different image sensors can be facilitated, thus facilitating obtaining a final image from the sub-images.

In one embodiment referring to the last-mentioned embodiment, said semiconductor substrate comprises a fourth active region different from said first, second and third active regions, said fourth active region establishing a fourth image sensor, and said at least one optics substrate comprises for said fourth image sensor at least one lens element for imaging light impinging on the optical apparatus from said front side onto the fourth image sensor.

For example, two image sensors may be provided for detecting green light, another image sensor for detecting red light, and a fourth one for detecting blue light.

In one embodiment which may be combined with one or more of the six last-mentioned embodiments, the optical apparatus comprises an image processing unit operationally connected to each of the (at least two) image sensors, for receiving sub-image data from each of the image sensors, and for obtaining a final image from said sub-image data.

The final image usually is a color image, be it an RGB or CMY or CMYK or others.

Typically, it is provided that said final image is independent of detection results obtained by means of said additional active region. And also typically, the processing in the image processing unit is carried out independent of what is detected in said additional active region.

In one embodiment which may be combined with one or more of the before-mentioned embodiments, the optical apparatus comprises an evaluation unit operationally connected to said additional active region, for evaluating detection results obtained by means of said additional active region.

In one embodiment referring to the last-mentioned embodiment, the optical apparatus comprises a display unit comprising a display and a control unit for controlling said display, wherein said control unit is operationally connected to said evaluation unit, for controlling said display unit in dependence of said detection results, more particularly in dependence of an evaluation of said detection results carried out by said evaluation unit. In particular, a brightness of the display (the term brightness here also including a switching off) may be controlled in dependence of said detection results or of said evaluation.

It can in particular be provided that said display faces into the same direction as said front side of the optical apparatus does. This can be particularly useful in case a proximity sensor and/or an ambient light sensor is provided (as additional sensor).

In one embodiment which may be combined with one or more of the before-mentioned embodiments, said additional sensor comprises an ambient light sensor, in particular said additional active region being provided for detecting an amount of visible light impinging on the optical apparatus from said front side. More particularly, the ambient light sensor can be provided for adjusting a brightness of a display of a display unit (cf. also the embodiment above) in dependence of said detected amount.

In one embodiment which may be combined with one or more of the before-mentioned embodiments, said additional sensor comprises a proximity sensor comprising a light emitter, in particular an infrared light emitter. More particularly, said additional active region is provided for detecting an amount of light (in particular infrared light) impinging on the optical apparatus from said front side. The proximity sensor can in particular be provided for adjusting a brightness of a display of a display unit (cf. also the embodiment above), more particularly for switching off and on said display in dependence of said detected amount.

Said light emitter may be attached to said semiconductor substrate, or is (if corresponding semiconductor manufacturing technologies are available) integrated in said semiconductor substrate, but it is also possible to provide that said light emitter is mounted on a base substrate on which also the semiconductor substrate is mounted.

In one embodiment which may be combined with one or more of the before-mentioned embodiments, said additional sensor comprises a pyroelectric temperature sensor. In this case, said additional active region may be provided for detecting a spectral distribution of light impinging on the optical apparatus from said front side.

Another alternative for the additional sensor is a capacitive and/or micro-machined and/or micro-mechanical temperature sensor. In this case, said additional active region may be provided for creating micromechanical and/or capacitive changes in dependence of temperature changes which are detectable by the sensor. It may be provided that these changes are evaluated by an evaluation unit (like the evaluation unit mentioned above), e.g., for deriving an ambient temperature.

In case of temperature sensors, a temperature derived by means of this (additional) sensor may be displayed by a display of a display unit such as by using a display unit as described above.

In one embodiment which may be combined with one or more of the before-mentioned embodiments, the optical apparatus comprises a housing comprising a continuous opening or transparent portion, wherein said opening or transparent portion, said semiconductor substrate and said at least one optics substrate are arranged such that
  a first portion of light impinging on said opening or transparent portion may pass through said at least one optics substrate and impinge on said first image sensor;
and, in particular, such that
  a further portion of light impinging on said opening or transparent portion may pass through said at least one optics substrate and impinge on said additional active region.

Typically, said opening or transparent portion is surrounded by a non-transparent portion of the housing.

When writing that light passes through said at least one optics substrate, it may more precisely be meant that light passes through a respective at least one lens element.

In case of at least two image sensors (cf. embodiments with a first and a second image sensor above), said opening or transparent portion, said semiconductor substrate and said at least one optics substrate are arranged such that furthermore
  a second portion of light impinging on said opening or transparent portion may pass through said at least one optics substrate and impinge on said second image sensor.

From the above, it is furthermore apparent, how this embodiment can be extended for the case that more than two image sensors and/or two or more additional sensors are provided.

The method for manufacturing an optical apparatus comprises the steps of
a) providing a semiconductor substrate comprising a first active region, said first active region establishing a first image sensor, said semiconductor substrate further comprising an additional active region different from said first active region, said additional active region establishing or being part of an additional sensor which is not an image sensor;
b) providing at least one optics substrate comprising for said first image sensor at least one lens element for imaging light impinging on the optical apparatus from a front side onto the respective image sensor;
c) obtaining said optical apparatus or a portion thereof by attaching said optics substrate to said semiconductor substrate;
wherein said optical apparatus or said portion thereof obtained in step c) is not subjected to any dicing steps.

Note that the step of attaching (cf. step c)) does not necessarily mean a direct attaching, but it is also possible, e.g., to use another substrate (base substrate) on which the semiconductor substrate is mounted and to (directly) attach the optics substrate or a spacer substrate to that (base) substrate.

Note that it is usually provided that after step c), the item obtained in step c) remains undivided.

In one embodiment of the method, step a) comprises the steps of a1) manufacturing a semiconductor wafer comprising a plurality of said semiconductor substrates;
a2) separating said semiconductor wafer into said plurality of semiconductor substrates.

Note that usually, steps a1), a2) are carried out before step c).

In another embodiment of the method which may be combined with the before-mentioned one, step b) comprises the steps of
b1) manufacturing an optics wafer or optics wafer stack comprising a plurality of said optics substrates;
b2) separating said optics wafer or optics wafer stack into said plurality of optics substrates.

Note that usually, steps b1), b2) are carried out before step c).

It is possible to provide that step b1) comprises manufacturing lens elements using replication, in particular embossing. E.g., on a precursor substrate of the optics substrate (usually having at least one generally flat side), one or more lens elements are produced, e.g., by embossing on wafer level. E.g., a curable epoxy material may be used for manufacturing the lens elements.

In case a first and a second image sensor (and corresponding first and second active regions) are present, the method for manufacturing an optical apparatus comprises the steps of
a) providing a semiconductor substrate comprising a first active region and a second active region different from said first active region, said first active region establishing a first image sensor, said second active region establishing a second image sensor, said semiconductor substrate further comprising an additional active region, different from said first and second active regions, said additional active region establishing or being part of an additional sensor which is not an image sensor;
b) providing at least one optics substrate comprising for each of said image sensors at least one lens element for imaging light impinging on the optical apparatus from a front side onto the respective image sensor;
c) obtaining said optical apparatus or a portion thereof by attaching said optics substrate to said semiconductor substrate;
wherein said optical apparatus or said portion thereof obtained in step c) is not subjected to any dicing steps.

The invention comprises methods with features of corresponding optical apparatuses according to the invention, and, vice versa, also optical apparatuses with features of corresponding methods according to the invention.

The advantages of the optical apparatuses basically correspond to the advantages of corresponding methods, and, vice versa, the advantages of the methods basically correspond to the advantages of corresponding optical apparatuses.

Further embodiments and advantages emerge from the dependent claims and the figures.

BRIEF DESCRIPTION OF THE DRAWINGS

Below, the invention is described in more detail by means of examples and the included drawings. The figures show schematically.

The described embodiments are meant as examples and shall not limit the invention.

DETAILED DESCRIPTION OF THE INVENTION

Figure 1:
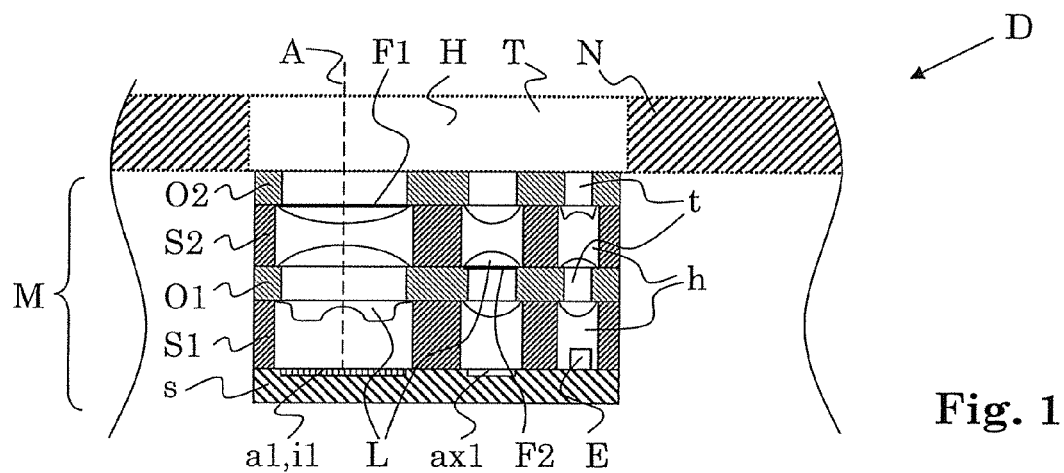
FIG. 1 a vertical cross-section through a detail of a device or optical apparatus comprising a module.

FIG. 1 schematically shows a vertical cross-section through a detail of device or optical apparatus D comprising a module M, more specifically an opto-electronic module M. The device D comprising a housing H on the inside of which module M is arranged. Housing H comprises a transparent portion T enclosed by a non-transparent portion N. Module M is arranged near or at transparent portion T such that light can enter module M through transparent portion T. Alternatively, an opening in housing H could be provided allowing light to enter module M. In this case, a front side of module M, e.g., formed by an optics substrate O2, could form a portion of housing H.

Device or optical apparatus-D may be, e.g., a smart phone and/or a mobile computing device and/or a photo camera.

Module M comprises several substrates s, S1, O1, S2, O2 stacked upon each other, e.g., glued to one another (pairwise).

Figure 2:
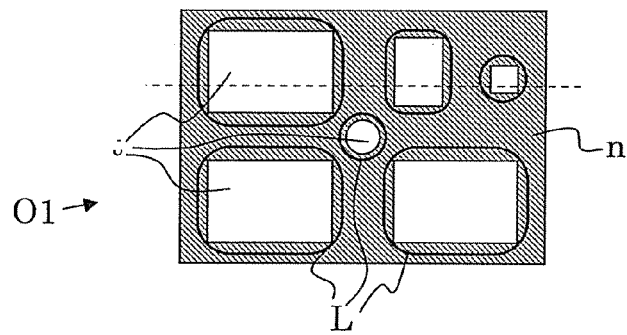
FIG. 2 a top view onto an optics substrate of FIG. 1.

FIG. 2 schematically shows a top view onto optics substrate O1 of FIG. 1.

Figure 3:
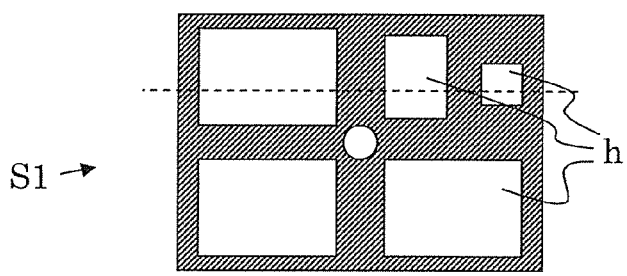
FIG. 3 a top view onto a spacer substrate of FIG. 1.

FIG. 3 schematically shows a top view onto a spacer substrate S1 of FIG. 1.

Figure 4:
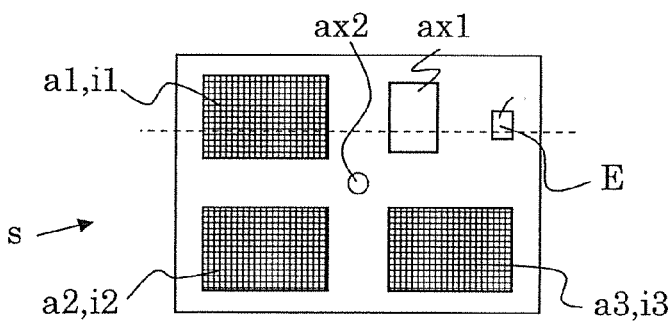
FIG. 4 a top view onto a semiconductor substrate of FIG. 1.

FIG. 4 schematically shows a top view onto a semiconductor substrate s of FIG. 1.

Module M is described referring to FIGS. 1 to 4. In FIGS. 2, 3 and 4, the dashed line indicates approximately where the cross-section of FIG. 1 is taken.

Semiconductor substrate s is a single-piece semiconductor substrate, typically substantially made of silicon. It comprises five active regions a1, a2, a3, ax1, ax2. Active regions a1, a2, a3 each form an image sensor i1, i2 and i3, respectively, each of which usually comprises more than 100×100 pixels, usually at least 1000×1000 pixels. Typically, each of the three image sensors is provided for detecting light of a different color.

Active region ax1 belongs to a proximity sensor and is usually provided for detecting infrared light. A light emitter E such as an infrared light emitting diode is provided on semiconductor substrate s for emitting the infrared radiation to be detected using active region ax1 after the radiation has left module M and device D and after it has been reflected (or scattered) outside device D and then entered module M again. Typically, light emitter E is operated in a pulsed fashion in order to improve the performance of the proximity sensor. Active region ax1 may function like a photo diode integrated in semiconductor substrate s, wherein a filter F2 may be provided on optics substrate O1 (or elsewhere in the detection channel of the proximity sensor) in order to avoid detection of non-infrared light in active region ax1.

Light emitter E is positioned on semiconductor substrate s, e.g., glued or soldered thereto (for providing mechanical stability and/or an electrical connection), and it may also have a wirebond connection to semiconductor substrate s, as indicated in FIG. 4. If suitable technologies are available for integrating light emitter E in semiconductor substrate s, light emitter E may alternatively be integrated in semiconductor substrate s.

Active region ax2 may also be a light-sensitive, light-detecting semiconductor area, like ax1, however, it may be an ambient light sensor or a portion-thereof. In this case, it may be provided for detecting visible light. A filter (not illustrated) could be provided in the light path between the front side of module M and active region ax2, for impeding the detection of infrared light such as of light emitted by light emitter E.

It is possible to provide, at at least a portion of the interface between semiconductor substrate s and spacer substrate S1, a cover glass (not illustrated), the main purpose of which usually is to protect the semiconductor structures of semiconductor substrate s.

Spacer substrate S1 is provided for ensuring a well-defined distance between semiconductor substrate s and optics substrate O1 and, more particularly, between the active areas on semiconductor substrate s and the lens elements L on optics substrate O1.

But furthermore, spacer substrate S1 may contribute to the housing of module M and to avoiding stray light detection in module M and to defining optical paths within module M. Spacer substrate S1 may be made of a non-transparent material such as a non-transparent epoxy resin (cured), having through-holes, usually one per optical channel. Spacer substrate S1 may be made using replication, e.g., embossing.

Spacer substrate S1 may also be made of an at least partially transparent material, in which case, however, non-transparent coatings may be provided for avoiding stray light detection in module M and better defining optical paths within module M.

Optics substrate O1 comprises transparent portions t (typically one per optical channel) surrounded by one or more non-transparent portions n (in FIG. 2, one is illustrated). Optics substrate O1 comprises at the transparent portions t (not necessarily at each one of them) one or more lens elements L which may be present at that side of optics substrate O1 which faces semiconductor substrate s and/or on the opposite side, in FIG. 1, lens elements L are illustrated on both sides.

The non-transparent portions n may be non-transparent portions because of being made of a non-transparent material and/or because of an applied non-transparent coating.

Instead of providing transparent portions t and one or more non-transparent portions n in optics substrate O1, optics substrate O1 could also be fully transparent. In that case, however, optics substrate O1 will not contribute (or contribute less) to avoiding stray light detection in module M and to defining optical paths within module M.

The lens elements L may be refractive ones and/or diffractive ones. And they may be convex and/or concave, in particular plano-convex and/or plano-concave. In particular, nominally substantially identical lens elements L may be provided for each of the light channels associated with a respective image sensor i1, i2, i3. The lens elements can redirect and focus or defocus light in a way needed for the functioning of module M. E.g., lens elements in the detection channel of the proximity sensor may be provided for collecting as much light as possible, and lens elements in the emission channel of the proximity sensor may be provided for guiding as much light as possible from light emitter E to the outside of module M, and lens elements in the light channel of the ambient light sensor may be used for achieving an increased sensitivity of active region ax2 for light impinging on the front side of module M at higher angles of incidence (e.g., above 40°) and a decreased sensitivity of active region ax2 for light impinging on the front side of module M at lower angles of incidence (e.g., below 40°). And for the image sensors, the respective lens elements L may be provided for achieving a particularly sharp and distortion-free image of a scene in front of the front side on the respective image sensor.

By each of the image sensors and usually also by the associated lens elements, an optical axis is defined, like the one referenced A indicated for image sensor i1 in FIG. 1 by a dashed line.

In order to produce a color image from sub-images captured using the different image sensors i1, i2, i3, different color filters may be provided in the respective light channels such as filter F1 for image sensor i1 embodied on optics substrate O2 as a coating. E.g., a green filter, a red filter and a blue filter may be provided for the image sensors i1, i2 and i3, respectively. From the three monochrome sub-images, a (final) color image can be computed.

The (color) filters may also be located in a different place and be realized in a different way. E.g., filters may also be present on semiconductor substrate s, in particular in case of patterned filters letting pass light of different color to different pixels of the same image sensor, see examples below.

Spacer substrate S2 may have functionalities and be designed and manufactured in full analogy to spacer substrate S1.

Optics substrate O2 may have functionalities and be designed and manufactured in full analogy to optics substrate O1, wherein it may be advantageous to have the front face of module 1 free from lens elements, in particular for achieving a simplified positioning of module M in device D.

One or both of spacer substrates S1 and S2 may be integrated in one or more of the adjacent optics substrates O1, O2. In other words, one or both of the optics substrates may incorporate the design and functionality of at least one of the spacer substrates.

Of course, optics substrate O2 is generally optional, and if optics substrate O2 is not present, also spacer substrate S2 is optional.

Typically, and as illustrated in FIGS. 1-4, the substrates of a module M (in the example of FIG. 1: substrates s, S1, O1, S2, O2) contribute to an usually even form (in full) the housing of the module M. And they are usually generally plate-shaped and have a rectangular outline (in the stacking direction; cf. FIGS. 2-4), usually describing the same rectangular.

Figure 5:
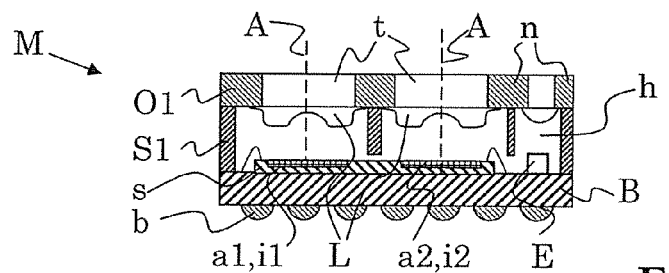
FIG. 5 a vertical cross-section through another module.

FIG. 5 schematically shows a vertical cross-section through another module M. In this case, only one spacer substrate and only one optics substrate is present. Compared to a case like illustrated in FIG. 1, this decreases the possibilities of guiding the light in module M and may thus provide a lower optical quality, however, such a module can be smaller and may be easier and cheaper to manufacture.

Another remarkable difference between the module of FIG. 1 and the one of FIG. 5 is that in FIG. 5, the semiconductor substrate s is attached to a base substrate B. Base substrate B may be, e.g., a printed circuit board or interposer. It provides electrical connections of module M to the outside by contact pads or, as indicated in FIG. 5, by solder balls b. And electrical connections present between semiconductor substrate s and base substrate B are also provided, e.g., by wire bonds, as schematically indicated in FIG. 5.

Note that in case a base substrate B is provided, semiconductor substrate s usually does not contribute to the housing of the module M, but the base substrate B does.

And another variant is illustrated by FIG. 5, namely to place an active optical component such as light emitter E on the base substrate B instead of on semiconductor substrate s. This saves space on semiconductor substrate s. Note that space on a semiconductor substrate is scarce and expensive. It is, however, not necessary but an option, to place, besides semiconductor substrate s, another active optical component of module M on base substrate B.

Otherwise, and generally in the present patent application, like reference symbols indicate like or corresponding items.

It is furthermore noted that a spacer substrate (such as S1 in FIG. 5) may comprise material portions extending (vertically) by less than the distance between the neighboring substrates (O1 and s in FIG. 5), as illustrated in FIG. 5.

Two, three or four, possibly even more image sensors may be realized in semiconductor substrate s, and possibly additional active regions may be realized in semiconductor substrate s, too. E.g., two image sensors for detecting green light, one for detecting red light and a fourth one for detecting blue light may be realized in semiconductor substrate s besides an active region for detecting infrared light originally emitted by light emitter E, such that a computational camera and a proximity sensor are, at least in part, realized in module M.

Figure 6:
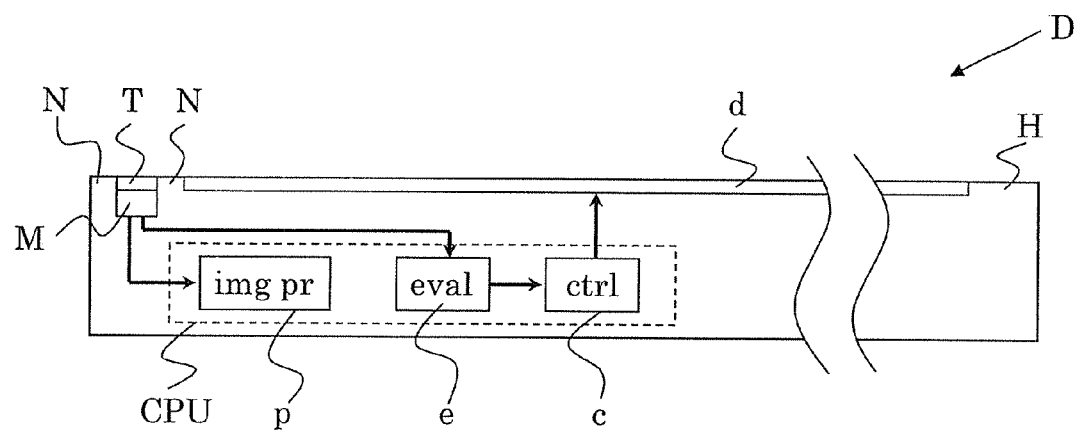
FIG. 6 a vertical cross-section through a device or optical apparatus comprising a module.

FIG. 6 schematically shows a vertical cross-section through another device or optical apparatus D comprising a module M. Device D comprises a display d, e.g., an LCD or OLED display, which is controlled by a control unit c. Furthermore, an evaluation unit e is provided for evaluating detection results of the additional (non-image) sensor present in module M, and an image processing unit p is provided for obtaining a (final) image from data from the one or more image sensors present in module M, in particular for computing a final (color) image from image data sets of sub-images obtained by N≥2 image sensors realized in semiconductor substrate s. Note that it is usually intended to design module M in such a way that each image sensor present therein will image substantially the same scene (at least for scenes more than 1 cm or rather more than 30 cm distant from the module's front side).

It is possible to realize the control unit c, the evaluation unit e and the image processing unit p in a processing unit CPU of the device D, e.g., in a central processor and/or in a graphics processor of the device D. However, it can be useful (in terms of making good use of semiconductor substrate s and/or in terms of fast processing and/or compactness) to arrange in full or in part one or both of the evaluation unit e and the image processing unit p in module M and, more specifically in semiconductor substrate s. Examples will be shown below.

As indicated by the arrows in FIG. 6, data are transmitted from module M to image processing unit p. Those data are usually those originating from the one or more image sensors of semiconductor substrate s. And further data are transmitted from module M to evaluation unit e, namely usually those data originating from one or more additional active regions of semiconductor substrate s (which do not embody image sensors). Control unit c may carry out its control function in dependence of the evaluation carried out in evaluation unit e. E.g., in dependence of data obtained from one or more additional (non-image) sensors of semiconductor substrate s, display d may be controlled, e.g., its brightness may be adjusted in dependence of a detection result of an ambient light sensor and/or its background light or the whole display d may be switched on and off in dependence of a detection result of a proximity sensor. The arrow from evaluation unit e to control unit c (which, more generally, may have different or addition control functions in device D than merely controlling display d) indicates this functional connection.

Furthermore, it will be provided in many applications that neither the image processing in image processing unit p is carried out in dependence of an evaluation result of the evaluation unit e nor that the evaluating in evaluation unit e is carried out in dependence of a processing result of image processing unit p. Note that, accordingly, no arrow is interconnecting units p and e in FIG. 6.

Note that a small single opening or transparent portion T in the device housing H may be sufficient—thanks to the provision of a module M as described in the present patent application—for providing light input to module M and, where necessary, light output from module M, for the several sensors of module M having different functionalities. This can strongly contribute to compactness of device D and to an improved manufacturability.

FIGS. 7 to 10 schematically illustrate various possibilities for providing and arranging active regions (image sensors and additional sensors or parts thereof) on a semiconductor substrate s. From the description of FIGS. 1 to 4 and 5, it will be clear how possible optics substrates and spacer substrates may be designed in order to manufacture a module M.

Figure 7:
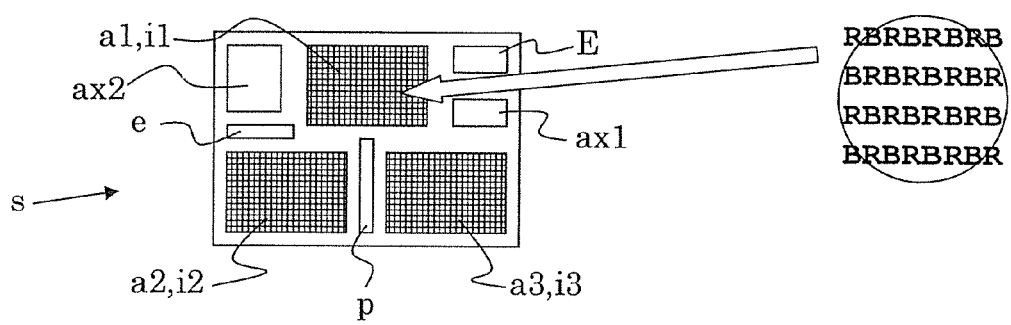
FIG. 7 a top view onto another semiconductor substrate.

FIG. 7 schematically shows a top view onto a semiconductor substrate s with (optionally) integrated evaluation unit e and image processing unit p. Like in FIG. 1, three image sensors i1, i2, i3 are provided which, however are differently arranged. Like in FIG. 1, two additional sensors such as an ambient light sensor and a proximity sensor are provided on semiconductor substrate s. Instead of having one image sensor for green light, one for red light and one for blue light, it is illustrated in FIG. 7 that it is alternatively also possible to have to image sensors (i2, i3) for green light, whereas the third image sensor i1 has a patterned filter (on semiconductor substrate s), namely such that red and blue pixels are distributed in a checkerboard pattern. The provision of two image sensors for the same color can facilitate the computation of the final (color) image from the sub-images of the (three) image sensors.

Figure 8:
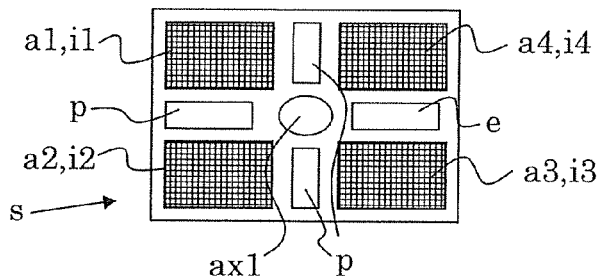
FIG. 8 a top view onto another semiconductor substrate.

FIG. 8 schematically shows a top view onto another semiconductor substrate s. Also here, image processing unit p and evaluation unit e are (optionally) integrated in substrate s. Instead of using three image sensors and a patterned filter, a facilitated computation of a final image from sub-images is accomplished by providing four image sensors, two of them in the same color, e.g., i1 and i3 for green and i2 for red and i4 for blue. The space in the middle between the four image sensors can be used for detecting light, e.g., for realizing an ambient light sensor (based on active region ax1).

Figure 9:
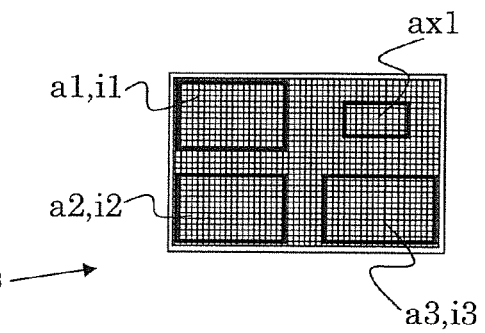
FIG. 9 a top view onto another semiconductor substrate.

FIG. 9 schematically shows a top view onto yet another semiconductor substrate. In this case, a very large pixel array is realized in semiconductor substrate s, and different portions thereof are read out for different purposes. Active regions a1, a2, a3 are read out and interpreted as sub-images, realizing three image sensors i1, i2, i3. And another portion, namely those pixels in additional active region ax1, are read out for realizing (or contributing to) another (additional) sensor such as an ambient light sensor. Even though active region ax1 basically could provide spatial resolution (due to the presence of pixels), this will—in typical applications—not be made use of, because only the sum of the detected light intensity over all pixels in active region ax1 is relevant. In an evaluation unit e, data from active region ax1 will thus not be interpreted as image data or as an image. Thus, active region ax1 does not embody (or contribute to) an image sensor. In particular, there will typically be at most than 100×100 pixels or even at most 50×50 pixels in active region ax1.

Of course, various ways of distributing image sensors and additional (non-image) sensors over a semiconductor substrate are possible, not only in case of a (large) pixel array as illustrated in FIG. 9, but also in the other described cases.

Figure 10:
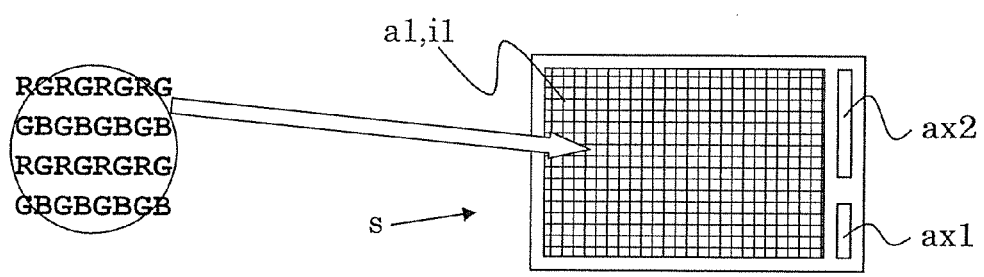
FIG. 10 a top view onto another semiconductor substrate.

Finally, FIG. 10 schematically shows a top view onto another semiconductor substrate s, in which case there is only one image sensor realized in semiconductor substrate s, such that no computational imaging is realized. Rather, a standard Bayer filter pattern ("RGGB") may be provided on semiconductor substrate s. However, at least one additional active area—as illustrated in FIG. 10, two additional active areas ax1, ax2—are realized. One may be or contribute to, e.g., an ambient light sensor, the other to a micromechanical and/or capacitive temperature sensor.

As will have become clear from the above, there are many possibilities of combining at least one image sensor and at least one additional active area on a semiconductor substrate s and/or in a module M. In particular, they may be all full-color image sensors, e.g., each with a Bayer pattern (RGGB), e.g., three or four or even more full-color image sensors on one semiconductor substrate 2. Or one or two full-color image sensors, e.g., each with a Bayer pattern (RGGB), may be combined, on one semiconductor substrate s, with one monochrome image sensor (e.g., for white light detection) or with two monochrome image sensors or rather with three (one for red, one of blue, one for green light detection). Or monochrome or full-color image sensors may be combined with one or more two-color sensors such as sensors with a checkerboard patterned filter for two different colors. The one or more additional active areas may generally embody or be comprised in a sensor of any kind, wherein at least one of the additional active areas may in particular be light-sensitive. Generally any combination of additional sensors is possible. And generally, any one additional sensor or any combination of two or more additional sensors may be combined, with any image sensor or combination of image sensors (cf. above).

Aspects of the embodiments have been described in terms of functional-units. As is readily understood, these functional units may be realized in virtually any number of hardware and/or software components adapted to performing the specified functions.

The invention claimed is:

1. An optical apparatus comprising
  a semiconductor substrate;
  at least one optics substrate;
  wherein said semiconductor substrate comprises:
    a first active region establishing a first image sensor,
    a second active region different from said first active region, said second active region establishing a second image sensor,
    a third active region different from said first and second active regions, said third active region establishing a third image sensor, and
    an additional active region, different from said first, second and third active regions, said additional active region establishing or being part of an additional sensor which is not an image sensor,
    wherein each of the first, second and third active regions is positioned within a different one of four quarters of a rectangle, said quarters being obtainable by twice dividing said rectangle by the two median lines of the rectangle, and wherein the additional active region is positioned within the one of said four quarters in which none of said first, second and third active regions is positioned, and wherein said at least one optics substrate comprises:
for said first image sensor, at least one lens element for imaging light impinging on the optical apparatus from a front side onto the first image sensor,
for said second image sensor, at least one lens element for imaging light impinging on the optical apparatus from a front side onto the second image sensor, and
for said third image sensor at least one lens element for imaging light impinging on the optical apparatus from said front side onto the third image sensor.

2. The optical apparatus according to claim 1, wherein said additional sensor is at least one of
an ambient light sensor;
a proximity sensor;
a temperature sensor, in particular a pyroelectric temperature sensor or a capacitive temperature sensor or a micro-mechanical temperature sensor.

3. The optical apparatus according to claim 1, wherein said at least one optics substrate comprises at least one additional lens element for imaging light impinging on the optical apparatus from a front side onto said additional active region.

4. The optical apparatus according to claim 1, wherein the optical apparatus is structured for detecting light of substantially different color ranges in said first and said second image sensors.

5. The optical apparatus according to claim 1, wherein a first optical axis defined by the first image sensor and by the respective at least one lens element and a second optical axis defined by the second image sensor and by the respective at least one lens element are aligned in parallel.

6. The optical apparatus according to claim 1, wherein
(i) said semiconductor substrate comprises a pixel array comprising said first and second image sensors and optionally also said additional active region; or
(ii) said first and second active regions are separated from each other by at least one intermediate region of said semiconductor substrate which is not specifically structured for detecting light and/or which is not used for detecting light.

7. The optical apparatus according to claim 1, wherein the optical apparatus constitutes at least a portion of a computational camera, wherein sub-images from which a final image is composed in said computational camera comprise a first sub-image obtainable by means of said first image sensor and a second sub-image obtainable by means of said second image sensor.

8. The optical apparatus according to claim 1, wherein said semiconductor substrate comprises a fourth active region different from said first, second and third active regions, said fourth active region establishing a fourth image sensor, and wherein said at least one optics substrate comprises for said fourth image sensor at least one lens element for imaging light impinging on the optical apparatus from said front side onto the fourth image sensor.

9. The optical apparatus according to claim 1, wherein said additional active region encompasses a point for which the sum of the distances from this point to the center of gravity of each of said image sensors is minimal, in particular wherein this point is the center of gravity of said additional active region.

10. The optical apparatus according to claim 1, comprising an image processing unit operationally connected to each of the image sensors, for receiving sub-image data from each of the image sensors, and for obtaining a final image from said sub-image data.

11. The optical apparatus according to claim 1, comprising an evaluation unit operationally connected to said additional active region, for evaluating detection results obtained by means of said additional active region.

12. The optical apparatus according to claim 11, comprising a display unit comprising a display and a control unit for controlling said display, wherein said control unit is operationally connected to said evaluation unit, for controlling said display unit in dependence of said detection results, more particularly in dependence of an evaluation of said detection results carried out by said evaluation unit.

13. The optical apparatus according to claim 12, wherein said additional sensor is
an ambient light sensor, said additional active region being provided for detecting an amount of visible light impinging on the optical apparatus from said front side, and for adjusting a brightness of a display of said display unit in dependence of said detected amount; or
a proximity sensor comprising a light emitter, in particular an infrared light emitter, said additional active region being provided for detecting an amount of light, in particular infrared light impinging on the optical apparatus from said front side, and for adjusting a brightness of a display of said display unit, more particularly for switching off and on said display in dependence of said detected amount.

14. The optical apparatus according to claim 1, wherein the optical apparatus is at least one of
an opto-electronic module;
a module for a device with computational camera capability;
a device with a display, in particular with a visual display;
a device with a housing, in particular with a housing having an opening or transparent portion;
a handheld computing device;
a handheld photographic device;
a handheld communication device;
a smartphone;
a tablet computer.

15. The optical apparatus according to claim 1, wherein the optical apparatus comprises a housing comprising a continuous opening or transparent portion, wherein said opening or transparent portion, said semiconductor substrate and said at least one optics substrate are arranged such that
a first portion of light impinging on said opening or transparent portion may pass through said at least one optics substrate and impinge on said first image sensor;
a further portion of light impinging on said opening or transparent portion may pass through said at least one optics substrate and impinge on said additional active region.

* * * * *